United States Patent
Yan et al.

(10) Patent No.: US 9,460,955 B2
(45) Date of Patent: Oct. 4, 2016

(54) INTEGRATED CIRCUITS WITH SHALLOW TRENCH ISOLATIONS, AND METHODS FOR PRODUCING THE SAME

(71) Applicant: GLOBALFOUNDRIES, Inc., Grand Cayman (KY)

(72) Inventors: Ran Yan, Dresden (DE); Nicolas Sassiat, Dresden (DE); Alban Zaka, Dresden (DE); Kun-Hsien Lin, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 352 days.

(21) Appl. No.: 14/092,232

(22) Filed: Nov. 27, 2013

(65) Prior Publication Data

US 2015/0145000 A1    May 28, 2015

(51) Int. Cl.
| | |
|---|---|
| *H01L 21/02* | (2006.01) |
| *H01L 21/762* | (2006.01) |
| *H01L 29/06* | (2006.01) |
| *H01L 29/78* | (2006.01) |
| *H01L 29/66* | (2006.01) |

(52) U.S. Cl.
CPC ..... *H01L 21/76224* (2013.01); *H01L 29/0653* (2013.01); *H01L 29/66636* (2013.01); *H01L 29/7848* (2013.01)

(58) Field of Classification Search
CPC .......... H01L 21/02381; H01L 21/0254; H01L 21/02505; H01L 29/66636; H01L 33/007
USPC .................................................. 257/190
See application file for complete search history.

(56) References Cited

U.S. PATENT DOCUMENTS

| | | | | |
|---|---|---|---|---|
| 8,058,133 B2* | 11/2011 | Tsai et al. | ...... | 438/300 |
| 8,471,334 B2* | 6/2013 | Ibi | ...... | 257/335 |

OTHER PUBLICATIONS

Oehrlein, G.S. et al., "Selective dry etching of silicon with respect to germanium," Appl. Phys. Lett., vol. 56, No. 15, Apr. 9, 1990.

* cited by examiner

*Primary Examiner* — Monica D Harrison
(74) *Attorney, Agent, or Firm* — Lorenz & Kopf, LLP (57) ABSTRACT

Integrated circuits with electrical components near shallow trench isolations and methods for producing such integrated circuits are provided. The method includes forming a trench is a substrate, where the trench has a trench surface. A barrier layer including silicon and germanium is formed overlying the trench surface. A shallow trench isolation is then formed with a core overlying the barrier layer, where the core includes a shallow trench isolation insulator.

18 Claims, 7 Drawing Sheets

INTEGRATED CIRCUITS WITH SHALLOW TRENCH ISOLATIONS, AND METHODS FOR PRODUCING THE SAME

TECHNICAL FIELD

The technical field generally relates to integrated circuits and methods for producing integrated circuits, and more particularly relates to integrated circuits with electrical components near shallow trench isolations and methods for producing such integrated circuits.

BACKGROUND

Integrated circuits use shallow trench isolations to separate and electrically isolate different active areas. The shallow trench isolation is typically an insulator embedded in a substrate of the integrated circuit, so the material of the substrate is interrupted at the shallow trench isolation. Integrated circuits also use many transistors, resistors, and other electrical components positioned on the substrate, and some of the electrical components use silicon germanium embedded within the substrate. In particular, some "P" type transistors use embedded silicon germanium for the source and drain, because the silicon germanium can be produced with a strained crystal structure that improves electron mobility. The silicon germanium is epitaxially grown from the crystalline structure of the substrate, and does not grow on areas without a crystalline structure.

The embedded silicon germanium for some electronic components will abut the shallow trench isolation, but the insulators typically used for shallow trench isolation do not support epitaxial growth. This results in a "ski slope" effect, where the embedded silicon germanium adjacent to the shallow trench isolation slopes into a channel or cavity that forms at the intersection of the shallow trench isolation and the embedded silicon germanium. Many transistors have a source and drain aligned to opposite sides of a gate, so the source/drain next to the shallow trench isolation is sloped and has a reduced volume compared to the other source/drain. This degrades the performance of the electrical component with embedded silicon germanium adjacent to a shallow trench isolation. As the commercial trend is for more circuitry on a chip, it may not be practical to move the embedded silicon germanium away from the shallow trench isolation.

Accordingly, it is desirable to provide integrated circuits with a shallow trench isolation that supports epitaxial growth of silicon germanium. In addition, it is desirable to provide methods for producing an integrated circuit with embedded silicon germanium adjacent to a shallow trench isolation that is comparable to embedded silicon germanium that is not adjacent to a shallow trench isolation. Furthermore, other desirable features and characteristics of the present embodiment will become apparent from the subsequent detailed description and the appended claims, taken in conjunction with the accompanying drawings and this background of the invention.

BRIEF SUMMARY

A method is provided for producing an integrated circuit. A trench is formed in a substrate, where the trench has a trench surface. A barrier layer including silicon and germanium is formed overlying the trench surface. A shallow trench isolation is then formed with a core overlying the barrier layer, where the core includes a shallow trench isolation insulator.

In a different embodiment, a method is provided for producing an integrated circuit. A shallow trench isolation is formed in a substrate, where the shallow trench isolation includes a barrier layer adjacent to the substrate, and where the barrier layer includes germanium. An embedded plug trough is formed in the substrate adjacent to the barrier layer, and an embedded plug is formed in the embedded plug trough such that the embedded plug contacts the barrier layer. The embedded plug includes silicon and germanium.

An apparatus is provided for an integrated circuit. The apparatus includes a substrate with a shallow trench isolation embedded within the substrate. The shallow trench isolation includes a core and a barrier layer, where the barrier layer is adjacent to the substrate. The core includes a shallow trench isolation insulator, and the barrier layer includes germanium. A transistor gate overlies the substrate, and a source and a drain are embedded within the substrate on opposite sides of the transistor gate. The source and drain include silicon and germanium, and one of the source and drain contacts the barrier layer.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

An integrated circuit includes a shallow trench isolation embedded within a substrate, where the shallow trench isolation divides the substrate into different regions or areas. The shallow trench isolation includes an outer barrier layer of silicon and germanium, an intermediate cap layer of an insulator such as silicon dioxide, and a central core of a shallow trench isolation insulator. An electronic component is positioned adjacent to the shallow trench isolation, where the electronic component includes an embedded plug of silicon and germanium formed in the substrate. The embedded plug of silicon and germanium contacts the silicon germanium barrier layer of the shallow trench isolation, so the embedded plug can be epitaxially grown on the barrier layer of the shallow trench isolation as well as on the substrate. Embedded silicon germanium tends to be repelled and form a sloped surface when grown adjacent to conventional shallow trench isolation insulators, as described above, but the silicon germanium barrier layer contemplated herein supports the epitaxial growth of the embedded plug so it does not have a sloped surface adjacent to the shallow trench isolation. This avoids a distorted, unpredictable shape for the embedded plug, which aids in reliability of the electronic component that uses the embedded plug, such as a transistor.

Figure 1:
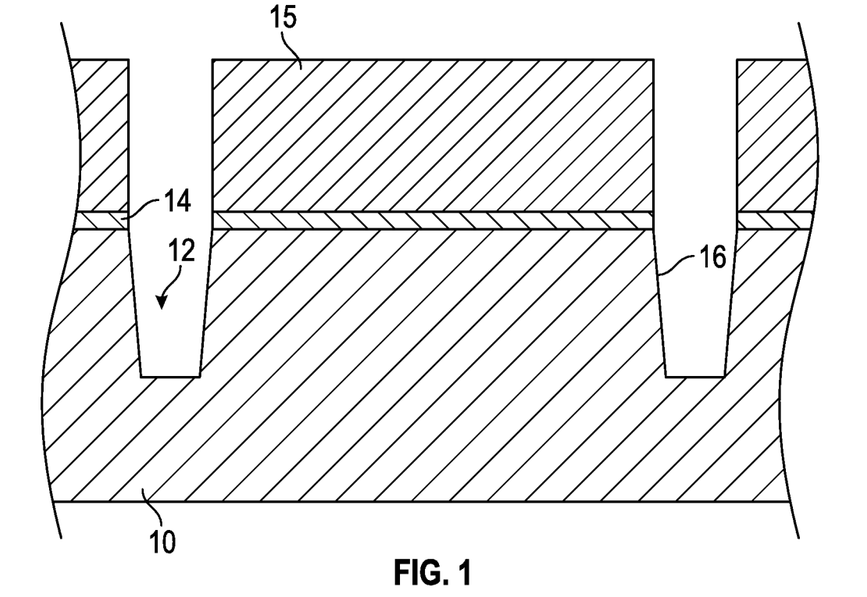
FIGS. 1-7 illustrate, in cross sectional views, a portion of an integrated circuit and methods for its fabrication in accordance with exemplary embodiments where a single transistor is positioned between two shallow trench isolations.

Reference is now made to an exemplary embodiment illustrated in FIG. 1. A shallow trench isolation is formed in a substrate 10, where the substrate is a monocrystalline semiconductor. As used herein, the term "semiconductor" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like. In an exemplary embodiment, the semiconductor material is a monocrystalline silicon substrate, which may or may not include impurity doping. The substrate 10 may be a bulk silicon wafer (as illustrated) or it may be a thin layer of silicon on an insulating layer (commonly known as silicon-on-insulator or SOI) that, in turn, is supported by a carrier wafer.

A trench 12 is formed in the substrate 10 for the shallow trench isolation, where the trench 12 can be formed by any suitable means. In an exemplary embodiment, an STI etch mask 14 of silicon nitride is formed overlying the substrate 10 by low pressure chemical vapor deposition using ammonia and dichlorosilane. As used herein, the term "overlying" means "over" such that an intervening layer may lay between the substrate 10 and the STI etch mask 14, and "on" such that the STI etch mask 14 physically contacts the substrate 10. An STI photoresist layer 15 is deposited overlying the STI etch mask 14, and patterned to the shape of the desired trench 12 or plurality of trenches 12. The STI photoresist layer 15 (and other photoresist layers described below) can be deposited by spin coating, patterned by exposure to light or other electromagnetic radiation, and the desired locations can be removed with an organic solvent. The trench 12 is then anisotropically etched through the STI etch mask 14, the STI photoresist layer 15, and into the substrate 10, such as by reactive ion etch with silicon hexafluoride. The trench 12 extends into the substrate 10 to a desired depth that is sufficient to electrically isolate adjacent sections of the substrate 10. The STI photoresist layer 15 is then removed with an oxygen containing plasma. The trench 12 has a trench surface 16 that is an exposed portion of the semiconductor material of the substrate 10.

Figure 2:
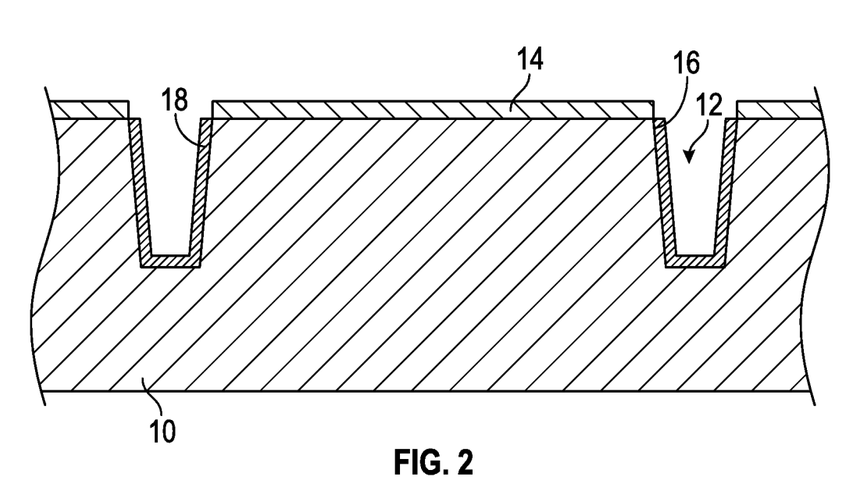

Referring now to FIG. 2, a barrier layer 18 is formed overlying the trench surface 16. The barrier layer 18 is made of silicon and germanium, and can be formed by epitaxial growth, chemical vapor deposition, or other appropriate means. For example, silicon and germanium can be epitaxially grown by molecular beam epitaxy, where the trench surface 16 is exposed to beams of atomic germanium and silicon. In an exemplary embodiment, the epitaxial growth is conducted in a plurality of layers beginning with a silicon concentration from about 100 percent to about 25 mass percent, where each subsequent layer has a higher concentration of germanium. The last layer, or the layer facing into the trench 12, is essentially pure germanium in some embodiments. Therefore, the barrier layer 18 has a germanium concentration gradient with a maximum barrier layer silicon concentration adjacent the substrate 10 and trench surface 16, and a maximum barrier layer germanium concentration opposite the substrate 10 and trench surface 16. In an embodiment, the barrier layer 18 is about 10 nanometers thick, but other thicknesses are also possible. The germanium atom is larger than the silicon atom, and epitaxial growth extends the crystal lattice structure of the substrate 10. The larger germanium atoms cannot conform to the crystal structure of the silicon unless there is a gradual transition. Therefore, the germanium concentration gradient facilitates better crystalline structure for the barrier layer 18. The epitaxial growth is limited to exposed crystalline structures, such as at the trench surface 16, so germanium and silicon are not deposited on the silicon nitride STI etch mask 14.

In an alternate exemplary embodiment, the barrier layer 18 is deposited by chemical vapor deposition in a silane or silicon tetrachloride ambient for the silicon portion, and germane for the germanium portion. Varying concentrations or ratios of the deposition gases can be used to deposit the barrier layer 18 with a germanium concentration gradient, similar to the epitaxial growth. Chemical vapor deposition leaves an overburden overlying the STI etch mask 14, where the overburden can be removed at a later stage, such as by chemical mechanical planarization.

Figure 3:
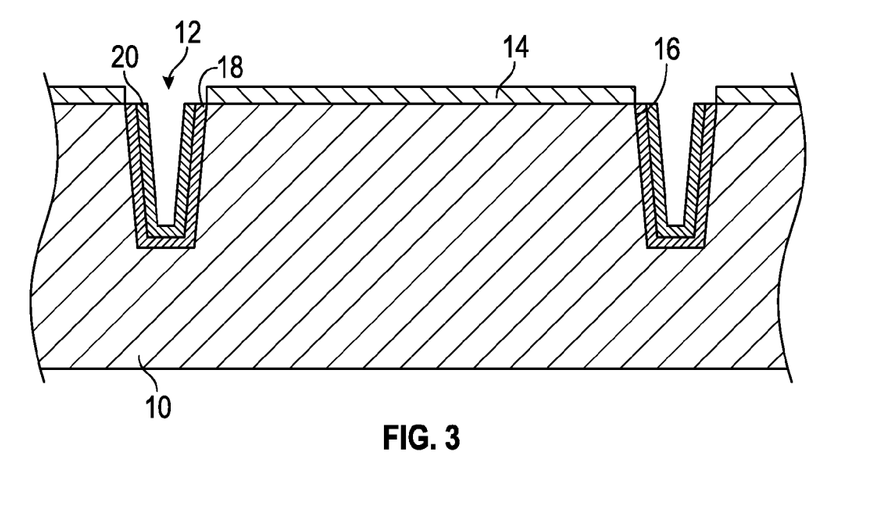

Referring now to FIG. 3, a cap layer 20 is formed overlying the barrier layer 18. In an exemplary embodiment, the cap layer 20 begins as silicon, and is later oxidized to form silicon oxide. The silicon can be epitaxially grown overlying the germanium in the barrier layer 18, or it can be deposited by chemical vapor deposition, as described above. If epitaxially grown, the silicon may not retain the crystalline structure from the outermost germanium in the barrier layer 18, because of the large crystalline strain induced by different atomic sizes, but the silicon is later converted to silicon oxide so there is no need to maintain the crystalline structure. The silicon layer can be converted to silicon oxide by exposure to an oxidizing ambient at elevated temperatures. For example, the silicon oxide can be formed by exposing the silicon to oxygen and steam at a temperature from about 900 degrees centigrade (° C.) to about 1,200° C. Oxidation of the silicon in the cap layer 20 is controlled to minimize or prevent oxidation of the underlying germanium in the barrier layer 18, because germanium oxide is a less stable insulator than silicon oxide. The silicon oxide can then be nitrided to form silicon oxynitride, such as by exposure to nitrogen gas at elevated temperatures of about 1,300° C. to about 1,400° C. Silicon oxynitride is stronger than silicon oxide to better protect the barrier layer 18. A silicon nitride, silicon oxide, silicon oxynitride, or other insulating cap layer 20 can be formed by other processes as well, but an initial coating of silicon limits exposure of the germanium in the barrier layer 18 to oxygen, and thereby minimizes the formation of germanium oxide.

Figure 4:
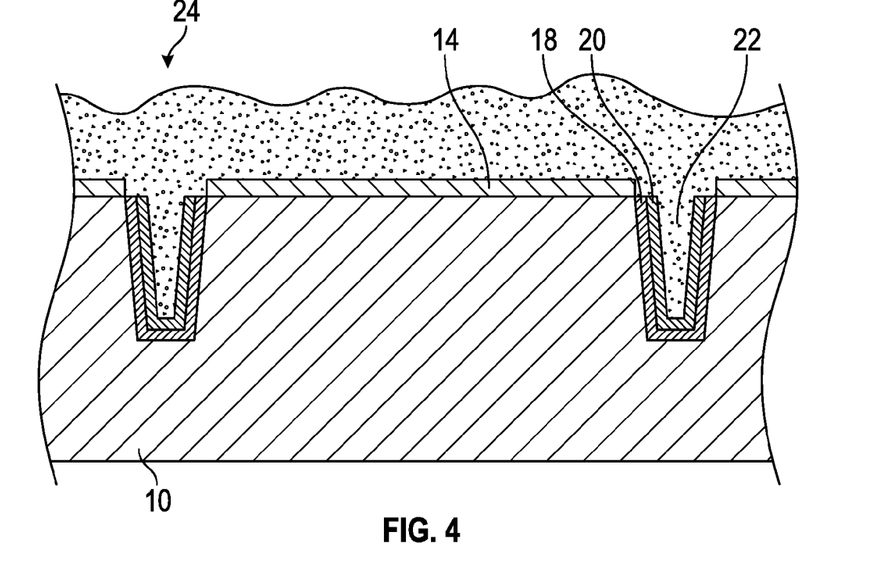

Reference is now made to FIG. 4. A core 22 of the shallow trench isolation 24 is filled with a shallow trench isolation insulator. The shallow trench isolation insulator is silicon oxide in an exemplary embodiment, which can be deposited by chemical vapor deposition in a silane and oxygen ambient, but other insulators could also be used. The shallow trench isolation insulator may leave an overburden overlying the STI etch mask 14. Formation of the barrier layer 18 and the cap layer 20 leaves an overburden in some embodiments as well, as discussed above.

Figure 5:
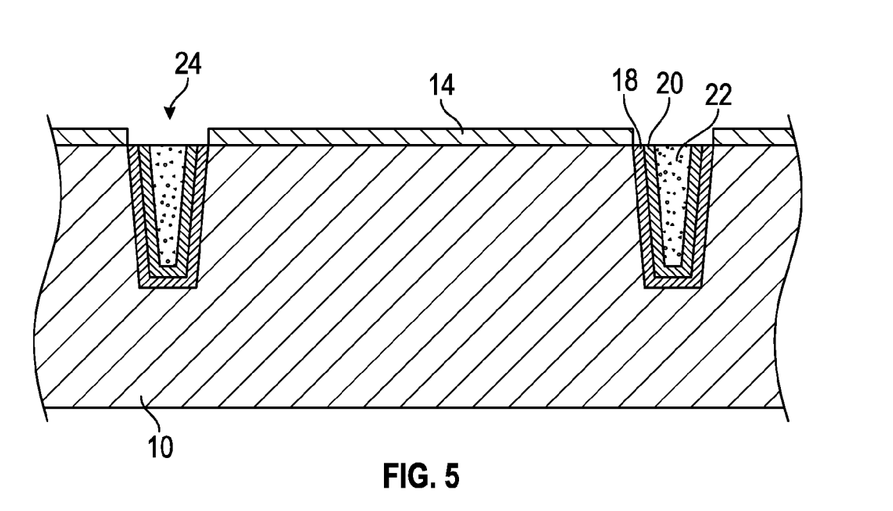
Figure 6:
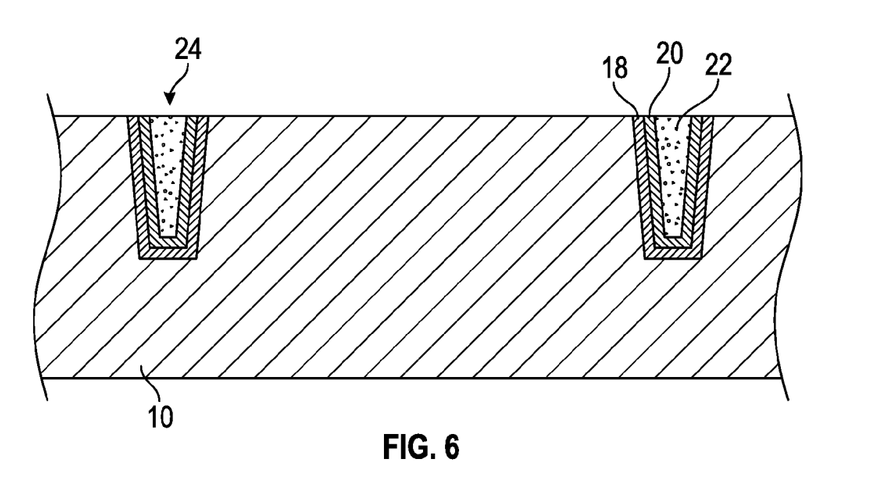

Referring now to FIG. 5, in an embodiment, the overburden is removed by chemical mechanical planarization. The STI etch mask 14 is silicon nitride in some embodiments, and silicon nitride is hard and strong, so it may not be removed in the chemical mechanical planarization process. Therefore, the STI etch mask 14 is removed by a selective etchant, such as a wet etch with hot phosphoric acid, as seen in FIG. 6. This produces a substrate 10 with embedded shallow trench isolations 24 that electrically separate the substrate 10 into a plurality of different regions. The substrate 10 is now available for production of various electronic components.

Figure 7:
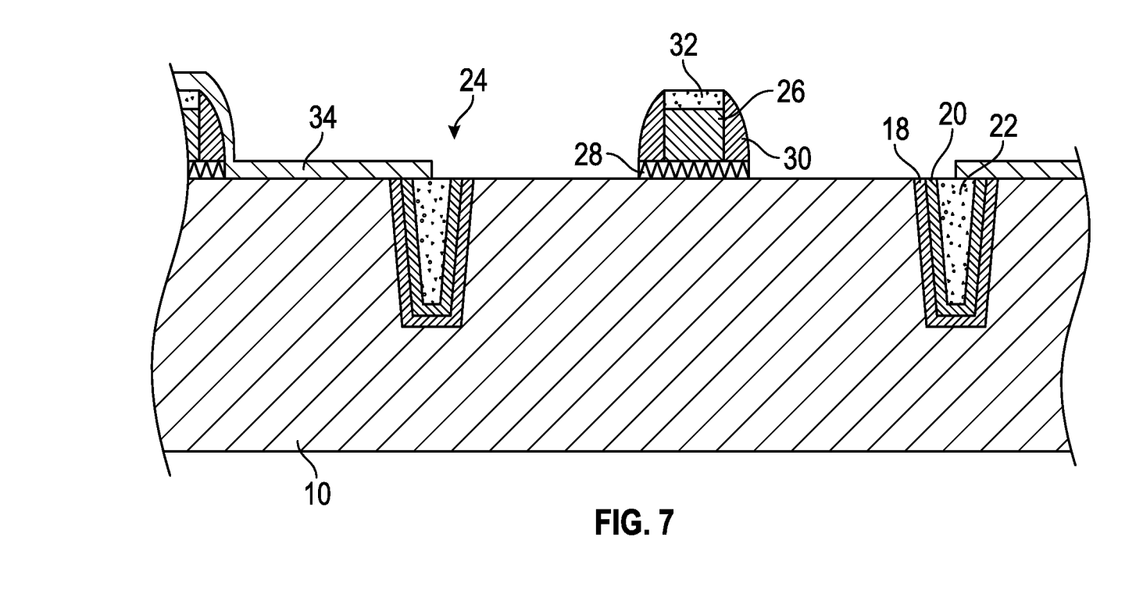

In an exemplary embodiment illustrated in FIG. 7, a transistor gate 26 is formed overlying the substrate 10, but other electronic components are also formed. The transistor gate 26 is formed using methods well known to those skilled in the art, and it can be formed of polysilicon, metal, or other materials in various embodiments. The method of formation and the design of the transistor gate are not critical in this description. The transistor gate 26 is typically formed overlying a gate insulator 28, and sidewall spacers 30 are often formed adjacent to the transistor gate 26. There may be a protective top 32 overlying the transistor gate 26, and the protective top 26 and sidewall spacers 30 can be silicon nitride, silicon oxide, silicon oxynitride, or other insulating materials. An isolation blanket 34 is formed overlying any electronic components to be separated and isolated from the processing steps described below. In an exemplary embodiment, the isolation blanket 34 is silicon nitride, which can be deposited by low pressure chemical vapor deposition using dichlorosilane and ammonia. An isolation blanket photoresist layer (not shown) can be deposited and developed to expose areas for further processing, so the isolation blanket 34 overlying the selected areas can be removed while remaining over the areas to be protected. The isolation blanket photoresist layer is then removed.

Figure 8:
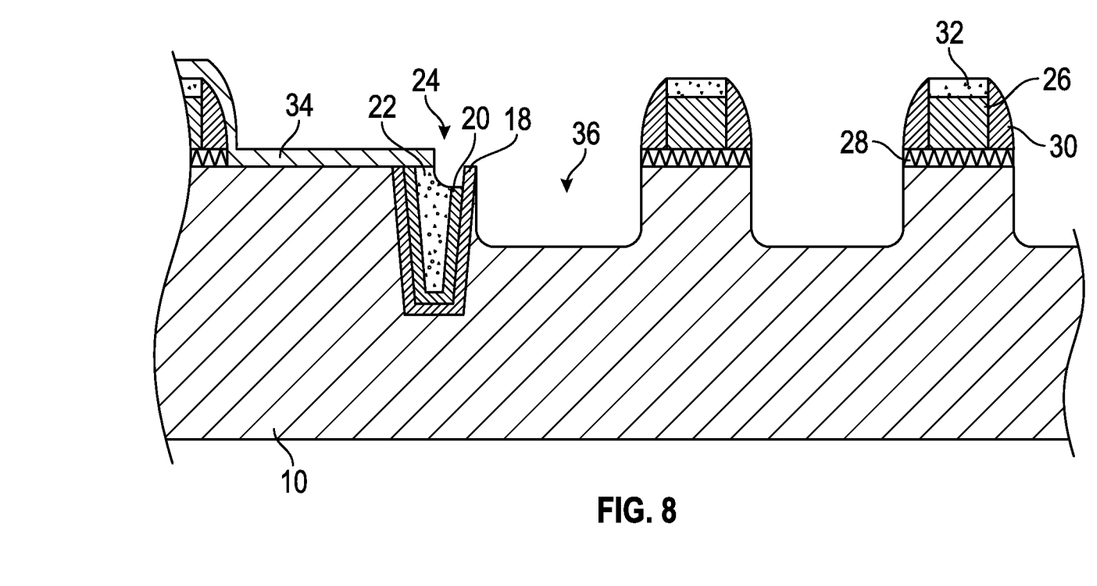
FIGS. 8-10 illustrate, in cross sectional views, a portion of an integrated circuit and methods for its fabrication in accordance with exemplary embodiments where an embedded plug is formed adjacent to a shallow trench isolation.

An embedded plug trough 36 is formed in the substrate 10 using an etchant more aggressive to silicon than germanium, as illustrated in FIG. 8. In an exemplary embodiment, a reactive ion etch or other dry etch with silicon hexafluoride, hydrogen gas, and carbon tetrafluoride is used to remove silicon about seventy times faster than it removes germanium. The dry etch may also remove some of the core 22 and cap layer 20 of the shallow trench isolation 24, but at a slower rate than silicon in the substrate 10. The barrier layer 18 includes germanium, so it remains largely in place. The reactive ion etch is anisotropic, so the embedded plug trough 36 primarily extends into the substrate in a vertical direction.

Figure 9:
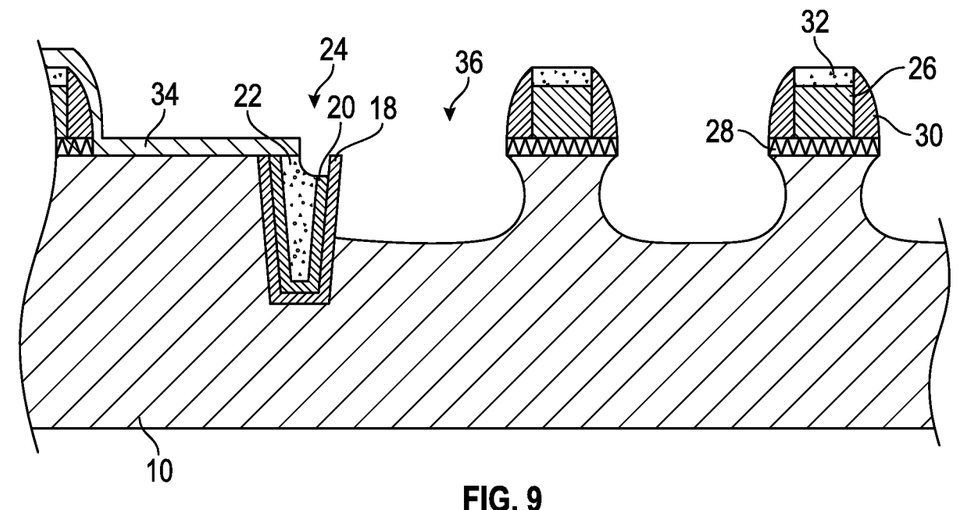

Referring now to FIG. 9, the embedded plug trough 36 is enlarged with a wet etch selective to silicon over germanium. In an exemplary embodiment, an ammonium hydroxide etchant is used because it is highly selective to silicon over germanium, with silicon etch rates over 100 times faster than germanium. The wet etch is isotropic, so some of the substrate 10 under the transistor gate 26 is etched away. The wet etch may also remove some of the core 22 and cap layer 20 of the shallow trench isolation 24, but at a slower rate than the silicon in the substrate 10. The barrier layer 18 remains in place due to its germanium content.

Figure 10:
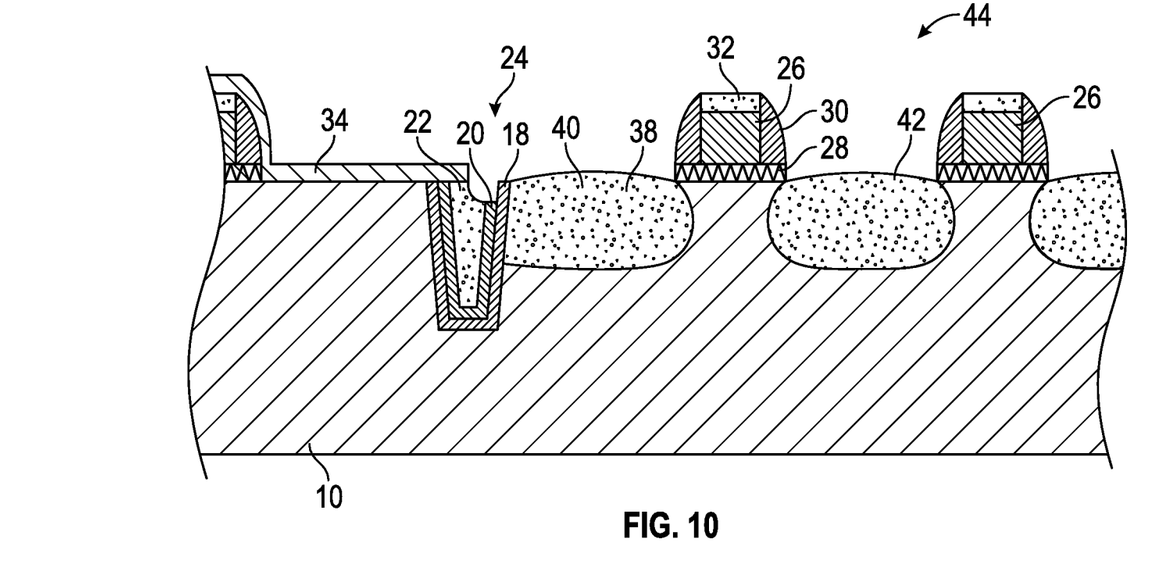

Reference is now made to FIG. 10. An embedded plug 38 is formed in the embedded plug trough 36, which is adjacent to the barrier layer 18 of the shallow trench isolation 24, and also adjacent to the transistor gate 26. The embedded plug 38 includes silicon and germanium, and can be epitaxially grown to produce a strained crystalline structure. The silicon and germanium can be epitaxially grown by molecular beam epitaxy using beams of atomic germanium and silicon at the desired ratio, as described above.

In an exemplary embodiment, the substrate 10 is monocrystalline silicon, so the larger germanium atoms in the silicon and germanium embedded plug 38 take more space and produce a compressive strain. The strained embedded plug 38 can be a source 40 or a drain 42 for a transistor, and is used as the source or drain for a "P" type transistor in many embodiments. The strain increases electron mobility to improve performance. The embedded plug 38 is the source 40 or drain 42 for a transistor, and the other of the source 40 or drain 42 is positioned on the opposite side of the transistor gate 26 to produce the transistor. The embedded plug 38 can also be used for other electronic components in alternate embodiments. The transistor or other electrical component is then used in the manufacture of an integrated circuit 44 using techniques know to those skilled in the art. In some embodiments, a protective silicon layer (not shown) is deposited overlying the embedded plug 38 to protect the germanium from oxygen, and thereby limit or prevent the formation of germanium oxide. The protective silicon layer is typically about 5 to 20 nanometers thick, but other thicknesses are possible, and can be deposited by epitaxial growth.

The embedded plug 38 is formed in contact with the barrier layer 18, and is compatible with the germanium and any remaining silicon in the barrier layer 18. Therefore, the embedded plug 38 does not form a "ski slope" or angled area adjacent to the shallow trench isolation 24. In embodiments where the embedded plug 38 is a source 40 or drain 42, the source volume is about the same as the drain volume because the epitaxial growth of the embedded plug 38 is about the same on the barrier layer 18 as on the silicon in the substrate 10. Therefore, in embodiments where the other of the source 40 or drain 42 is not positioned adjacent to a shallow trench isolation 24, the source volume and drain volume remain about the same.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of producing an integrated circuit comprising:
   forming a trench in a substrate, wherein the trench comprises a trench surface;
   forming a barrier layer overlying the trench surface, wherein the barrier layer comprises silicon and germanium with a germanium concentration gradient, wherein a maximum barrier layer silicon concentration is adjacent the trench surface; and
   forming a shallow trench isolation by forming a core overlying the barrier layer, wherein the core comprises a shallow trench isolation insulator.

2. The method of claim 1 wherein forming the barrier layer overlying the trench surface further comprises forming the barrier layer overlying the trench surface by epitaxial growth.

3. The method of claim 1 further comprising:
   forming a cap layer overlying the barrier layer, wherein the cap layer is positioned between the barrier layer and the core.

4. The method of claim 3 wherein forming the cap layer overlying the barrier layer further comprises forming the cap layer by depositing silicon overlying the barrier layer by epitaxial growth, and oxidizing the silicon to produce silicon oxide.

5. The method of claim 4 wherein forming the cap layer further comprises nitriding the silicon oxide to produce silicon oxynitride.

6. The method of claim 1 further comprising:
forming an embedded plug in the substrate, wherein the embedded plug comprises silicon and germanium, and wherein the embedded plug contacts the barrier layer.

7. The method of claim 6 further comprising:
forming a transistor gate overlying the substrate; and
forming a source and a drain in the substrate on opposite sides of the transistor gate, wherein the embedded plug is one of the source or the drain, and wherein a source volume is about equal to a drain volume.

8. The method of claim 1 wherein forming the shallow trench isolation by forming the core with the shallow trench isolation insulator further comprises forming the shallow trench isolation by forming the core with the shallow trench isolation insulator wherein the shallow trench isolation insulator comprises silicon oxide.

9. A method of producing an integrated circuit comprising:
forming a shallow trench isolation in a substrate, wherein the shallow trench isolation comprises a barrier layer adjacent to the substrate, wherein the barrier layer comprises germanium, wherein the shallow trench isolation comprises a core and a cap layer, and wherein the cap layer is positioned between the core and the barrier layer;
forming an embedded plug trough in the substrate adjacent to the barrier layer; and
forming an embedded plug in the embedded plug trough such that the embedded plug contacts the barrier layer, wherein the embedded plug comprises silicon and germanium.

10. The method of claim 9 wherein forming the shallow trench isolation further comprises forming the core comprising a shallow trench isolation insulator, wherein the shallow trench isolation insulator comprises silicon oxide.

11. The method of claim 9 wherein forming the shallow trench isolation further comprises forming the cap layer, wherein the cap layer comprises silicon oxynitride.

12. The method of claim 11 wherein forming the shallow trench isolation further comprises forming the cap layer by forming a layer of silicon overlying the barrier layer, oxidizing the layer of silicon to form silicon oxide, and nitriding the silicon oxide to form the silicon oxynitride.

13. The method of claim 9 wherein forming the shallow trench isolation further comprises forming the barrier layer with a germanium concentration gradient wherein a maximum barrier layer silicon concentration is adjacent the substrate.

14. The method of claim 9 wherein forming the shallow trench isolation in the substrate further comprises forming the barrier layer by epitaxial growth.

15. The method of claim 9 further comprising:
forming a transistor gate overlying the substrate; and
forming a source and a drain in the substrate on opposite sides of the transistor gate, wherein the embedded plug is one of the source or the drain.

16. The method of claim 15 wherein forming the source and the drain further comprises forming the source and the drain from silicon and germanium wherein the source and the drain are strained.

17. The method of claim 15 wherein forming the source and the drain further comprises forming the source and the drain such that a source volume is about equal to a drain volume.

18. An integrated circuit comprising:
a substrate;
a shallow trench isolation embedded within the substrate, wherein the shallow trench isolation comprises a core overlying a barrier layer such that the barrier layer is adjacent to the substrate, wherein the core comprises a shallow trench isolation insulator, wherein the shallow trench isolation comprises a cap layer positioned between the core and the barrier layer, and wherein the barrier layer comprises germanium;
a transistor gate overlying the substrate; and
a source and a drain embedded within the substrate, wherein the source and the drain comprise silicon and germanium, wherein the source and the drain are positioned on opposite sides of the transistor gate, and wherein one of the source and the drain contacts the barrier layer.

* * * * *